(12) United States Patent
Peng et al.

(10) Patent No.: US 10,763,453 B2
(45) Date of Patent: Sep. 1, 2020

(54) WIRING METHOD FOR SPECIAL-SHAPED OLED PRODUCT AND SPECIAL-SHAPED OLED PRODUCT

(71) Applicant: Kunshan Visionox Technology Co., Ltd., Kunshan (CN)

(72) Inventors: Lijuan Peng, Kunshan (CN); Gaomin Li, Kunshan (CN); Yao Hong, Kunshan (CN)

(73) Assignee: Kunshan Visionox Technology Co., Ltd., Kunshan (CN)

( * ) Notice: Subject to any disclaimer, the term of this patent is extended or adjusted under 35 U.S.C. 154(b) by 0 days.

(21) Appl. No.: 16/316,889

(22) Filed: Jan. 10, 2019

(65) Prior Publication Data

US 2019/0207148 A1 Jul. 4, 2019

Related U.S. Application Data

(63) Continuation of application No. PCT/CN2017/099269, filed on Aug. 28, 2017.

(30) Foreign Application Priority Data

Aug. 31, 2016 (CN) .......................... 2016 1 0790088

(51) Int. Cl.
*H01L 51/52* (2006.01)
*H01L 51/56* (2006.01)
(Continued)

(52) U.S. Cl.
CPC ...... *H01L 51/5209* (2013.01); *H01L 27/3276* (2013.01); *H01L 51/0021* (2013.01);
(Continued)

(58) Field of Classification Search
CPC ............. H01L 51/5209; H01L 51/0021; H01L 51/5225; H01L 51/5253; H01L 51/56; H01L 27/3276
See application file for complete search history.

(56) References Cited

U.S. PATENT DOCUMENTS 9,997,731 B2 *  6/2018  Vehoff ................ H01L 51/5203
10,224,469 B2 *  3/2019  Hata ..................... H05K 1/0269
(Continued)

FOREIGN PATENT DOCUMENTS

CN    102082161 A    6/2011
CN    102468450 A    5/2012
(Continued)

OTHER PUBLICATIONS

CN First Office Action dated May 18, 2018 in CN Application No. 201610790088.0, Includes English Translation. 10 pages.
(Continued)

*Primary Examiner* — Christine A Enad

(57) ABSTRACT

A wiring method for a special-shaped OLED product includes: forming an isolation pillar layer on an insulation layer, wherein the insulation layer includes an insulation layer of a display portion and an insulation layer of a frame portion, the isolation pillar layer includes an isolation pillar layer of the display portion and an isolation pillar layer of the frame portion, and the insulation layer of the frame portion is covered by the isolation pillar layer of the frame portion; forming a cathode material layer on the isolation pillar layer, wherein the cathode material layer includes a cathode material layer of the display portion and a cathode material layer of the frame portion, the cathode material layer of the frame portion is located between isolation pillars
(Continued)

of the isolation pillar layer of the frame portion, and the cathode material layer of the frame portion is used as a cathode.

13 Claims, 3 Drawing Sheets

(51) Int. Cl.
    *H01L 27/32*    (2006.01)
    *H01L 51/00*    (2006.01)
    *H01L 51/50*    (2006.01)

(52) U.S. Cl.
    CPC ...... *H01L 51/5225* (2013.01); *H01L 51/5253* (2013.01); *H01L 51/56* (2013.01); *H01L 51/5012* (2013.01); *H01L 2251/301* (2013.01); *H01L 2251/308* (2013.01)

(56) References Cited

U.S. PATENT DOCUMENTS

2008/0218061 A1\* 9/2008 Chao ................... H01L 27/3248
    313/504
2011/0254022 A1\* 10/2011 Sasano ................ H01L 25/0753
    257/88
2017/0309851 A1\* 10/2017 Vehoff ................ H01L 51/5203

FOREIGN PATENT DOCUMENTS

| CN | 102723445 A | 10/2012 |
| CN | 103187534 A | 7/2013 |
| CN | 105679793 A | 6/2016 |
| CN | 105739154 A | 7/2016 |
| CN | 106206669 A | 12/2016 |
| TW | M471626 | 2/2014 |
| WO | 2009/096204 A | 8/2009 |

OTHER PUBLICATIONS

CN Second Office Action dated Sep. 4, 2018 in CN Application No. 201610790088.0, Includes English Translation. 7 pages.
PCT International Search Report dated Dec. 4, 2017 in International Application No. PCT/CN2017/099269, Includes English Translation. 7 pages.
PCT Written Opinion dated Dec. 4, 2017 in Internation Application No. PCT/CN2017/099269, Includes English Translation. 13 pages.

\* cited by examiner

WIRING METHOD FOR SPECIAL-SHAPED OLED PRODUCT AND SPECIAL-SHAPED OLED PRODUCT

CROSS-REFERENCE TO RELATED APPLICATIONS

The present application is a continuation of International Patent Application No. PCT/CN2017/099269 filed on Aug. 28, 2017, which claims priority to Chinese Patent Application No.201610790088.0, filed on Aug. 31, 2016, all contents of which are incorporated by reference herein.

TECHNICAL FIELD

Embodiments of the present disclosure relate to the technical field of manufacturing processes for organic light-emitting diode (OLED) products, and specifically, to a wiring method for a special-shaped OLED product and a special-shaped OLED product.

BACKGROUND

With the outbreak of wearable products, in order to meet market requirements, that is, the design is carried out in a space with a compact profile, limited design space and peculiar profile, thus many special-shaped OLED products, for example, bracelets, watches and other products with OLED displays, have been developed. The special-shaped OLED product refers to an OLED product with a display region having an unconventional square shape, and the shape of the display region thereof may be, for example, a circle, an ellipse, or other irregular shapes.

At present, the frame portion of the special-shaped OLED product mainly employs left and right wiring manner. For example, at the frame portion, the anode line and the cathode line employ left and right wiring manner. However, the left and right wiring manner may cause the frame portion of the OLED product to be relatively wide, thus failing to meet the narrow frame requirement.

SUMMARY

Therefore, one of the technical problems to be solved by embodiments of the present disclosure is to provide a new wiring method for a special-shaped OLED product and a special-shaped OLED product, so as to improve the manufacturing process of the OLED and reduce the product frame.

According to an embodiment of the present disclosure, a wiring method for a special-shaped OLED product is provided, including: forming an isolation pillar layer on an insulation layer, wherein the insulation layer includes an insulation layer of a display portion and an insulation layer of a frame portion, the isolation pillar layer includes an isolation pillar layer of the display portion and an isolation pillar layer of the frame portion, and the insulation layer of the frame portion is covered by the isolation pillar layer of the frame portion; forming a cathode material layer on the isolation pillar layer, wherein the cathode material layer includes a cathode material layer of the display portion and a cathode material layer of the frame portion, the cathode material layer of the frame portion is located between a plurality of isolation pillars of the isolation pillar layer of the frame portion, and the cathode material layer of the frame portion is used as a cathode.

According to an embodiment of the present disclosure, a special-shaped OLED product is provided, including: an isolation pillar layer formed on an insulation layer, wherein the insulation layer includes an insulation layer of a display portion and an insulation layer of a frame portion, the isolation pillar layer includes an isolation pillar layer of the display portion and an isolation pillar layer of the frame portion, and the insulation layer of the frame portion is covered by the isolation pillar layer of the frame portion; and a cathode material layer formed on the isolation pillar layer, wherein the cathode material layer includes a cathode material layer of the display portion and a cathode material layer of the frame portion, the cathode material layer of the frame portion is located between a plurality of isolation pillars of the isolation pillar layer of the frame portion, and the cathode material layer of the frame portion is used as a cathode.

In the wiring method for a special-shaped OLED product according to embodiments of the present disclosure, the insulation layer of the frame portion is covered by the isolation pillar layer of the frame portion, the cathode material of the frame portion is disposed between the plurality of isolation pillars of the isolation pillar layer of the frame portion, so that the cathode material is used as the cathode of the frame portion due to the division of the isolation pillars, thus achieving the effect that the frame portion and the display portion share a cathode line. In this way, compared with the traditional wiring method, an ITO layer and a MoAlMo layer may be omitted, so that the process technology in manufacturing the OLED product may be optimized, the product yield may be improved, and the product cost may be reduced.

BRIEF DESCRIPTION OF DRAWINGS

In conjunction with the accompanying drawings and with reference to the following detailed description, the feature, advantage and other aspect of each embodiment of the present disclosure will become more apparent. In the drawings.

DETAILED DESCRIPTION

The principle and spirit of the present disclosure will be described below with reference to some exemplary embodiments in conjunction with accompanying drawings. It should be understood that the embodiments are given only to enable those skilled in the art to better understand the present disclosure and further implement the present disclosure, and are not to limit the scope of the present disclosure in any manner.

Figure 1:
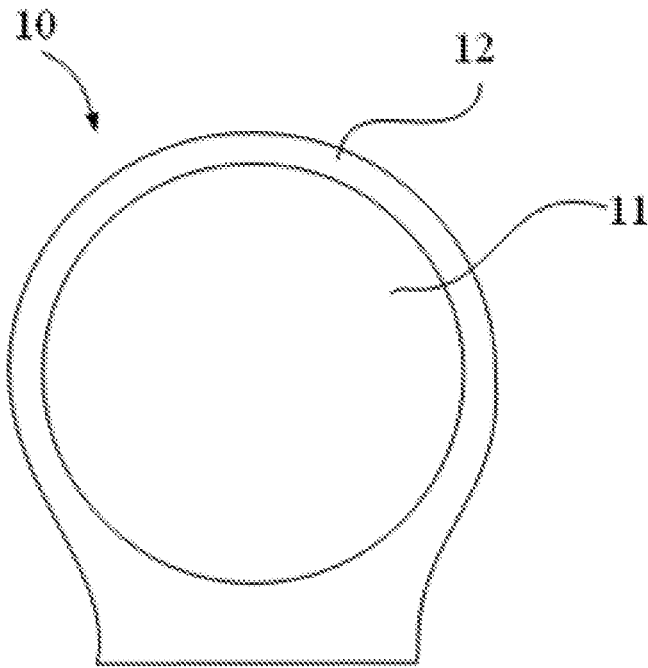
FIG. 1 shows an illustrative front view of a special-shaped OLED product in the prior art.

FIG. 1 shows a front view of an example of a special-shaped OLED product according to an embodiment of the present disclosure. The special-shaped OLED product is a smart watch 10 the profile of which is circular and the frame of which is narrow, including a special-shaped display portion 11 and a frame portion 12. The special-shaped OLED product is not limited thereto, and the shape of the display region thereof may be, for example, a circle, an ellipse, or other irregular shapes.

Figure 2:
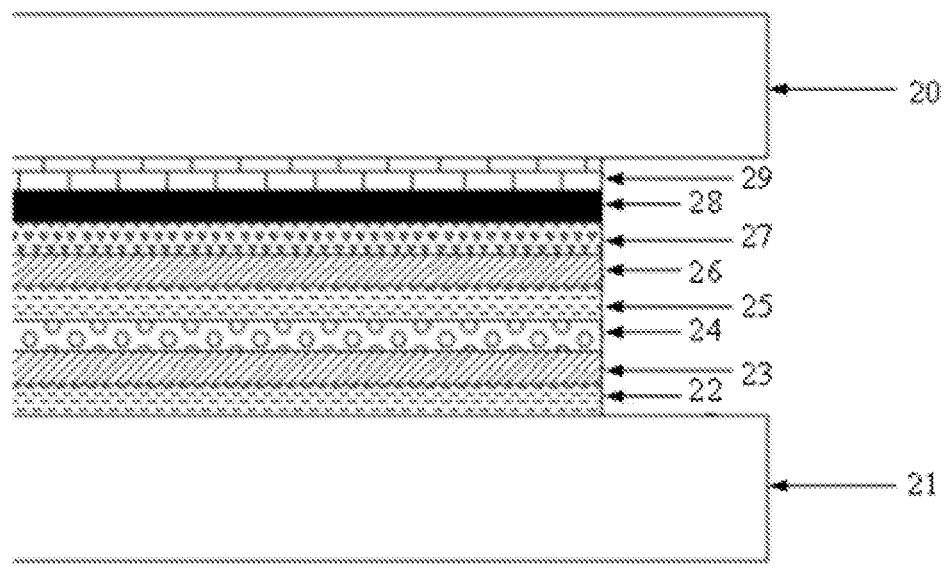
FIG. 2 shows an illustrative cross-sectional view of a frame portion of a special-shaped OLED product formed by a wiring method according to an embodiment of the present disclosure.
Figure 3:
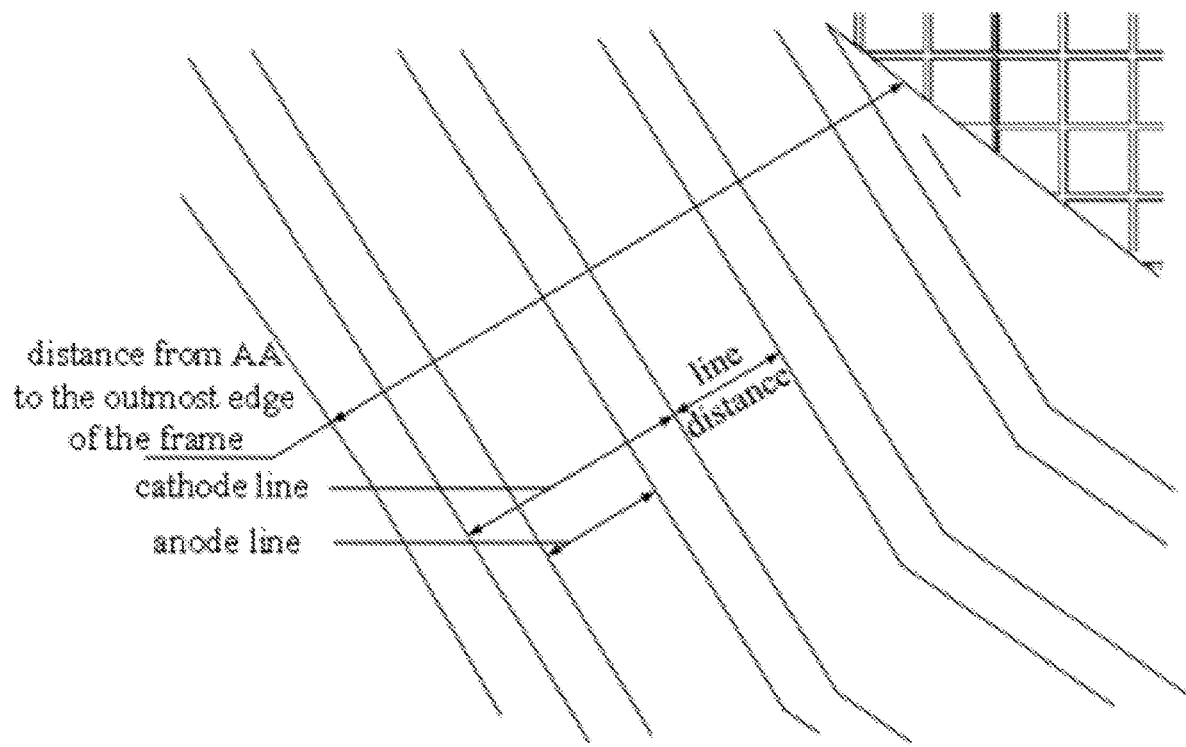
FIG. 3 shows an illustrative top view of the special-shaped OLED product shown in FIG. 2 in a wiring software design interface.

FIG. 2 shows a cross-sectional view of a frame portion of a special-shaped OLED product formed by a wiring method according to an embodiment of the present disclosure. In order to reduce the frame of the OLED product, it may be employed the frame of OLED product which is formed by a wiring manner of superposing up and down. As shown in FIG. 2, at a connection between the frame portion and a display portion of the OLED product formed by the wiring manner, it includes, from bottom to top, a substrate layer 21, an ITO layer 22, a MoAlMo layer 23, an insulation layer 24, an ITO layer 25, a MoAlMo layer 26, an isolation pillar layer 27, a light emitting layer 28, a cathode aluminum 29 and an encapsulation glass 20. FIG. 3 shows an illustrative top view of the wiring manner of the special-shaped OLED product shown in FIG. 2. Both an anode line and a cathode line are lines composed of the ITO layer 25 and the MoAlMo layer 26. The anode line (corresponding to the ITO layer 25 and the MoAlMo layer 26 in FIG. 2) is connected to the display portion of the OLED. The periphery of the cathode line (corresponding to the ITO layer 22 and the MoAlMo layer 23 in FIG. 2) is connected to the cathode aluminum 29. The insulation layer 24 is located at the intersection of the anode line and the cathode line and is used to separate the anode line and the cathode line. In this wiring manner, the anode line and the cathode line are vertically wired up and down, which saves space compared with the conventional left and right wiring manner, so that the frame of the OLED product is reduced. In an actual production, through the above-mentioned up and down wiring manner of the anode line and the cathode line, the joining edge between the display portion and the frame portion of the LED product may be about 1.6 mm away from the outmost edge of the frame of the OLED product.

Figure 4:
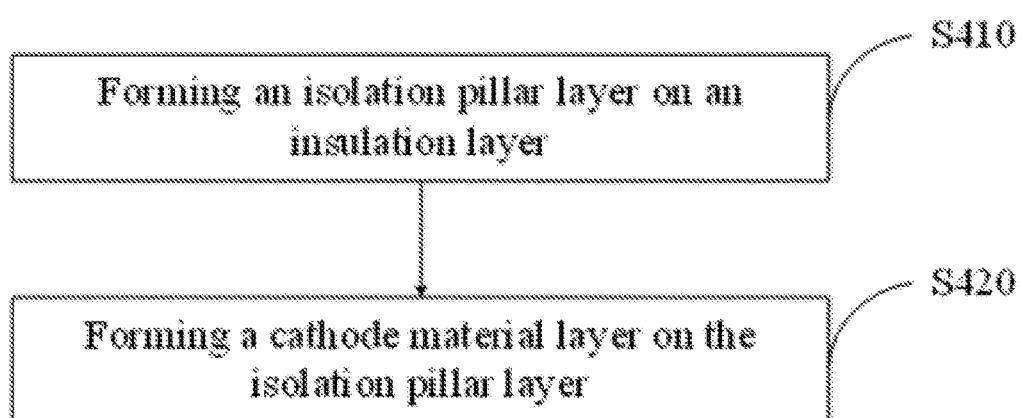
FIG. 4 shows an illustrative flowchart of a wiring method for a special-shaped OLED product according to an embodiment of the present disclosure.

FIG. 4 shows a flowchart of a wiring method for a special-shaped OLED product according to an embodiment of the present disclosure. In the wiring method mentioned in the embodiment of the present disclosure, an isolation pillar layer and a cathode material of the display portion are further extended to the frame portion. For example, an insulation layer of the frame portion is completely or mostly covered by the isolation pillar layer. At the same time, the cathode material is extended between a plurality of isolation pillars. Specifically, as shown in FIG. 4, the method includes:

Step S410: forming an isolation pillar layer on an insulation layer, wherein the insulation layer includes an insulation layer of a display portion and an insulation layer of a frame portion, the isolation pillar layer includes an isolation pillar layer of the display portion and an isolation pillar layer of the frame portion, and the insulation layer of the frame portion is covered by the isolation pillar layer of the frame portion;

Step S420: forming a cathode material layer on the isolation pillar layer, wherein the cathode material layer includes a cathode material layer of the display portion and a cathode material layer of the frame portion, the cathode material layer of the frame portion is located between a plurality of isolation pillars of the isolation pillar layer of the frame portion, and the cathode material layer of the frame portion is used as a cathode.

In the above method, the anode line of the frame portion is a line composed of an ITO layer and a MoAlMo layer, and the line is connected to the display portion. The cathode line of the frame portion is obtained by extending the cathode line layer between the plurality of the isolation pillars of the isolation pillar layer of the display portion above the anode (above the insulation layer). In this case, the anode line and the cathode line of the frame portion are superposed up and down, so that the size of the frame of the product is greatly reduced. Meanwhile, the cathode line of the frame portion and the cathode line of the display portion are connected and on a same plane (the two lines may also be considered to share the cathode line), so that the wiring method of the embodiment of the present disclosure does not require an additional process layer, and the wiring is simple.

Those skilled in the art understand that when the above method refers to "the cathode material layer of the frame portion is located between a plurality of isolation pillars of the isolation pillar layer of the frame portion", it may mean that the cathode material of the frame portion is directly and continuously disposed between the plurality of the isolation pillars, it may also mean that the cathode material is discontinuously disposed between the plurality of the isolation pillars, as long as finally, the cathode material of the frame portion between the isolation pillars covering on the insulation layer forms a continuous connection, and is generally in one plane with the cathode material of the display portion.

In addition, during an actual implementation, the isolation pillar layer of the display portion and the isolation pillar layer of the frame portion may be integrally manufactured, and the cathode material layer of the display portion and the cathode material layer of the frame portion may also be integrally manufactured.

The special-shaped OLED product to which the wiring method 400 can be applied may be an OLED product having a circular profile, an elliptical profile, or an irregular profile, such as an OLED product having a circular profile, an elliptical profile, or other irregular profiles on the front surface and having a narrow frame.

In one embodiment, before forming the isolation pillar layer on the insulation layer, the method further includes: forming a substrate layer; forming an ITO layer and a MoAlMo layer on the substrate layer, wherein the ITO layer and the MoAlMo layer include an ITO layer and an MoAlMo layer of the display portion and an ITO layer and an MoAlMo layer of the frame portion, and the ITO layer and the MoAlMo layer of the frame portion are used as an anode; and forming the insulation layer on the ITO layer and the MoAlMo layer.

Figure 5:
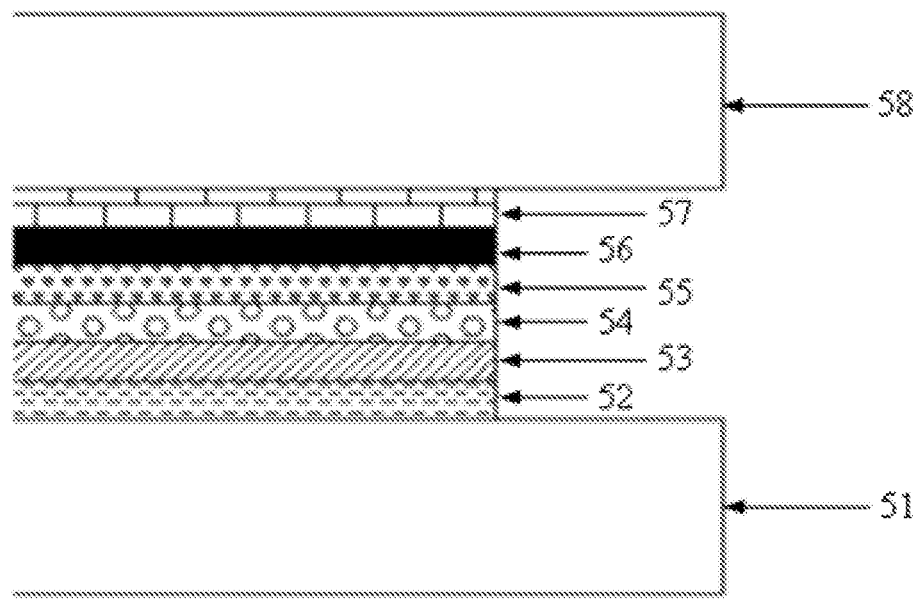
FIG. 5 shows an illustrative cross-sectional view of a frame portion of a special-shaped OLED product formed by a wiring method according to an embodiment of the present disclosure.

FIG. 5 shows a cross-sectional view of a frame portion of a special-shaped OLED product formed by a wiring manner according to an embodiment of the present disclosure. The special-shaped OLED product includes: an isolation pillar layer formed on an insulation layer, wherein the insulation layer includes an insulation layer of a display portion and an insulation layer of the frame portion, the isolation pillar layer includes an isolation pillar layer of the display portion and an isolation pillar layer of the frame portion, and the insulation layer of the frame portion is covered by the isolation pillar layer of the frame portion; and a cathode material layer formed on the isolation pillar layer, wherein the cathode material layer includes a cathode material layer of the display portion and a cathode material layer of the frame portion, the cathode material layer of the frame portion is located between a plurality of isolation pillars of the isolation pillar layer of the frame portion, and the cathode material layer of the frame portion is used as a cathode. As shown in FIG. 5, a cross section at a connection between the frame portion and the display portion of the special-shaped OLED product includes, from bottom to top, a substrate layer 51, an ITO layer 52, a MoAlMo layer 53, an insulation layer 54, an isolation pillar layer 55, a light emitting layer 56, a cathode material layer 57 and an encapsulation glass 58 disposed in this order. At the edge of the frame portion away from the display portion, the cross section thereof may include, from bottom to top, a substrate layer 51, an ITO layer 52, a MoAlMo layer 53, an insulation layer 54, an isolation pillar layer 55 and a cathode material layer 57. That is, the insulation layer 54 of the frame portion is provided with the isolation pillar layer 55 of the display portion. Meanwhile, the cathode material layer 57 of the display portion is disposed between the plurality of the isolation pillars of the isolation pillar layer 55. That is, the cathode material is disposed in a groove of the isolation pillars. In addition, the ITO layer 52 and the MoAlMo layer 53 are connected to the display portion and used as an anode line of the frame portion, the cathode material separated by the isolation pillars is used as a cathode line of the frame portion, and the anode line and the cathode line are separated by the insulation layer 54.

In an embodiment of the present disclosure, the encapsulation glass 58 may also be replaced with an encapsulation film and/or other materials, and this layer may be collectively referred to as an encapsulation layer.

In an embodiment of the present disclosure, as described above, the ITO layer and the MoAlMo layer are only one implementation manner of the anode layer (the layer at where the anode line is located), and may be replaced with other materials having the same effect in practice applications.

Figure 6:
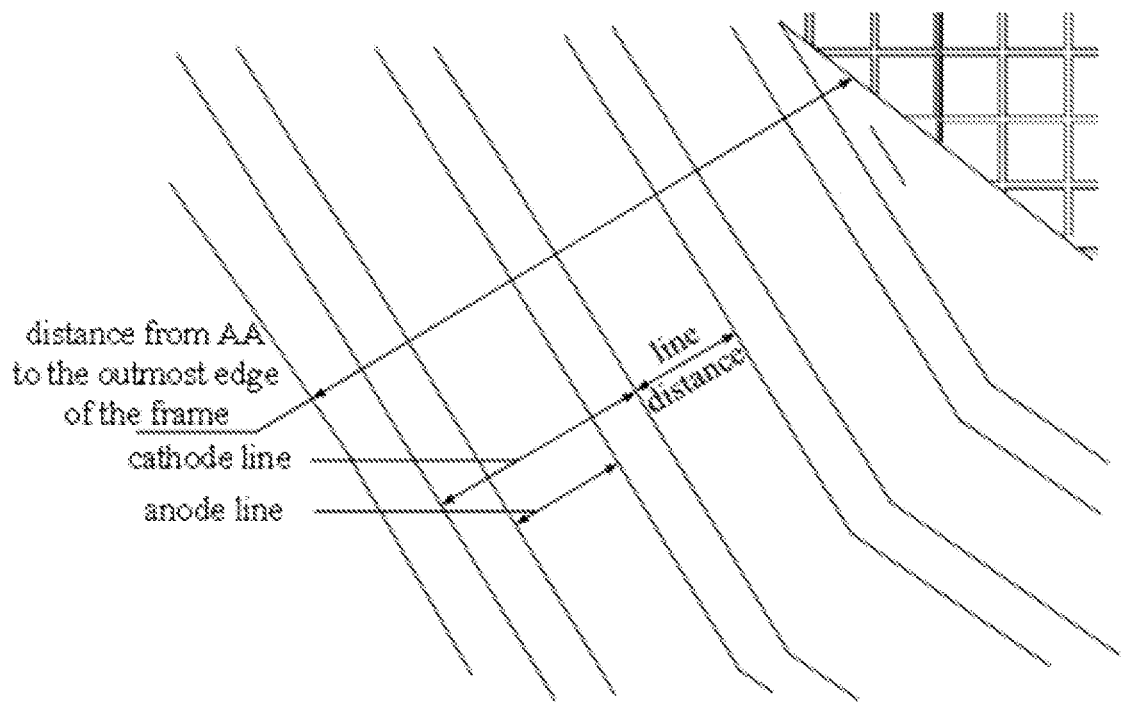
FIG. 6 shows an illustrative top view of each wiring layer of the special-shaped OLED product shown in FIG. 5 in a wiring software design interface.

FIG. 6 shows an illustrative top view of each wiring layer of the special-shaped OLED product shown in FIG. 5 in a wiring software design interface. AA is the joining edge between the display portion and the frame portion of the OLED product. Those skilled in the art may understand that the ITO layer and the MoAlMo layer are usually represented by one line in the wiring software design drawing. In FIG. 6, only lines composed of the ITO layer 52 and the MoAlMo layer 53 can be seen, but the number of lines composed of the ITO layer 52 and the MoAlMo layer 53 in this plane cannot be seen. As shown in FIG. 5, the ITO layer 52 and the MoAlMo layer 53 (see the anode line in FIG. 6) as the anode line of the frame portion and the cathode material layer 57 (see the cathode line in FIG. 6) as the cathode line of the frame portion are formed by superposing up and down with the insulation layer 54 interposed therebetween. What the line distance in FIG. 6 describes is the distance between two pairs of anode line and cathode line pair. This superposing manner makes the distance between AA and the outmost edge of the frame of the OLED product is about 1.6 mm, i.e., less than the left and right wiring manner. Meanwhile, in this case, since the process of additionally adding the ITO layer and the MoAlMo layer as the cathode line is not required, the total number of layers of the OLED product mentioned in the embodiment of the present disclosure is similar to the left and right wiring manner, that is, no additional layers are required.

It should also be understood that although in the above description, the cathode material of the special-shaped OLED product may be a metal aluminum layer, those skilled in the art may understand that the cathode material may also be aluminum, magnesium, silver, or an alloy containing aluminum, magnesium or silver, and any other suitable materials that may be used as the cathode of the OLED product.

According to embodiments of the present disclosure, the frame portion and the display portion of the special-shaped OLED product employ a manner of sharing cathode, which enable the manufacturing process of the special-shaped OLED product to be simple, the power consumption of the product to be low, and the cost to be saved by sharing equipment, and at the same time, enable the frame of the product to be small, and the typesetting rate to be high.

It should be understood that, for the sake of clarity, there is shown only the relevant partial wiring layers, or partial lines of the partial layers, not shown all.

The description of the present disclosure has been presented for purposes of illustration and description, but it is not intended to be exhaustive or limited to the present disclosure. Many modifications and variations will occur to those skilled in the art. All modifications and alterations without departing from the spirit of the present disclosure will fall within the protection scope of the present disclosure defined by the appended claims.

What is claimed is:

1. A wiring method for a special-shaped OLED product, comprising:
    forming an anode layer on a substrate layer, the anode layer comprising an anode layer of a display portion and an anode layer of a frame portion, the anode layer of the frame portion comprising an anode material;
    forming an insulation layer on the anode layer;
    forming a cathode material layer on the insulation layer, the cathode material layer comprising a cathode material layer of the display portion and a cathode material layer of the frame portion, and the cathode material layer of the frame portion comprising a cathode material corresponding to the anode material;
    forming an isolation pillar layer on the insulation layer, the insulation layer comprising an insulation layer of the display portion and an insulation layer of the frame portion;
    forming a light emitting layer disposed between the isolation pillar layer and the cathode material layer.

2. The wiring method according to claim 1, wherein forming the cathode material layer on the insulation layer comprises:
    forming the cathode material layer on the isolation pillar layer, the cathode material layer comprising a cathode material layer of the display portion and a cathode material layer of the frame portion, the cathode material layer of the frame portion comprising a cathode material between a plurality of isolation pillars of the isolation pillar layer of the frame portion, and the cathode material layer of the frame portion being used as a cathode.

3. The wiring method according to claim 1, wherein the isolation pillar layer of the display portion and the isolation pillar layer of the frame portion are integrally manufactured, and/or
    the cathode material of the display portion and the cathode material layer between the plurality of the isolation pillars are integrally manufactured.

4. The wiring method according to claim 1, wherein the cathode material layer of the frame portion and the cathode material layer of the display portion are connected and on a same plane.

5. The wiring method according to claim 1, wherein forming an anode layer on a substrate layer, the anode layer comprising an anode layer of a display portion and an anode layer of a frame portion, the anode layer of the frame portion comprising an anode material comprises:
   forming an ITO layer and a MoAlMo layer on the substrate layer, the ITO layer and the MoAlMo layer comprising an ITO layer and an MoAlMo layer of the display portion and an ITO layer and an MoAlMo layer of the frame portion, and the ITO layer and the MoAlMo layer of the frame portion being used as an anode; and
   forming an insulation layer on the anode layer comprises:
   forming the insulation layer on the ITO layer and the MoAlMo layer.

6. The wiring method according to claim 1, wherein the cathode material layer is made of aluminum, magnesium, silver or an alloy containing aluminum, magnesium or silver.

7. The wiring method according to claim 1, wherein the special-shaped OLED product is a product having a circular profile, an elliptical profile, or an irregular profile.

8. A special-shaped OLED product, comprising:
   an anode layer formed on a substrate layer, the anode layer comprising an anode layer of a display portion and an anode layer of a frame portion, and the anode layer of the frame portion comprising an anode material;
   an insulation layer formed on the anode layer;
   a cathode material layer formed on the insulation layer, the cathode material layer comprising a cathode material layer of the display portion and a cathode material layer of the frame portion, and the cathode material layer of the frame portion comprising a cathode material corresponding to the anode material;
   an isolation pillar layer formed on the insulation layer, the insulation layer comprising an insulation layer of a display portion and an insulation layer of a frame portion;
   a light emitting layer disposed between the isolation pillar layer and the cathode material layer.

9. The special-shaped OLED product according to claim 8, wherein the cathode material layer of the frame portion is disposed between a plurality of isolation pillars of the isolation pillar layer of the frame portion, and the cathode material layer of the frame portion is used as a cathode.

10. The special-shaped OLED product according to claim 8, wherein the cathode line of the frame portion and the cathode line of the display portion are connected and on a same plane.

11. The special-shaped OLED product according to claim 8, wherein the anode layer is an ITO layer and a MoAlMo layer, a cross section at a connection between the frame portion and the display portion comprises, from bottom to top, a substrate layer, an ITO layer, a MoAlMo layer, an insulation layer, an isolation pillar layer, a light emitting layer, a cathode material layer and an encapsulation layer disposed in this order, or a cross section at an edge of the frame portion away from the display portion comprises, from bottom to top, a substrate layer, an ITO layer, a MoAlMo layer, an insulation layer, an isolation pillar layer, and a cathode material layer.

12. The special-shaped OLED product according to claim 8, wherein the cathode material is aluminum, magnesium, silver or an alloy containing aluminum, magnesium or silver.

13. The special-shaped OLED product according to claim 8, wherein the special-shaped OLED product is a product having a circular profile, an elliptical profile, or an irregular profile.

* * * * *